US010046550B2

(12) United States Patent
Smith et al.

(10) Patent No.: US 10,046,550 B2
(45) Date of Patent: *Aug. 14, 2018

(54) CARRIER-SUBSTRATE ADHESIVE SYSTEM

(71) Applicant: Massachusetts Institute Of Technology, Cambridge, MA (US)

(72) Inventors: Henry I. Smith, Sudbury, MA (US); Corey P. Fucetola, Somerville, MA (US); Katherine A. Mirica, Quechee, VT (US); Jay J. Fucetola, Cambridge, MA (US); Dakota S. Freeman, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 14 days.

This patent is subject to a terminal disclaimer.

(21) Appl. No.: 15/161,646

(22) Filed: May 23, 2016

(65) Prior Publication Data

US 2016/0263882 A1    Sep. 15, 2016

Related U.S. Application Data

(63) Continuation-in-part of application No. 14/459,879, filed on Aug. 14, 2014, now Pat. No. 9,359,198.
(Continued)

(51) Int. Cl.
*B29C 65/52*  (2006.01)
*B32B 37/08*  (2006.01)
(Continued)

(52) U.S. Cl.
CPC ............ *B32B 43/006* (2013.01); *B82Y 10/00* (2013.01); *H01L 21/6835* (2013.01);
(Continued)

(58) Field of Classification Search
USPC .............. 156/247, 249, 307.3, 701, 711, 713
See application file for complete search history.

(56) References Cited

U.S. PATENT DOCUMENTS

| 4,070,117 A | 1/1978 | Johannsmeier et al. |
| 5,087,585 A | 2/1992 | Hayashi |
| (Continued) | | |

FOREIGN PATENT DOCUMENTS

| CA | 2314183 C | 10/2006 |
| CN | 101425583 A | 5/2009 |
| (Continued) | | |

OTHER PUBLICATIONS

International Search Report and Written Opinion dated Nov. 17, 2014 in co-pending PCT application No. PCT/US14/51181.
(Continued)

*Primary Examiner* — Sing P Chan
(74) *Attorney, Agent, or Firm* — Nields, Lemack & Frame, LLC

(57) ABSTRACT

A system and method for creating three-dimensional nanostructures is disclosed. The system includes a substrate bonded to a carrier using a bonding agent. The bonding agent may be vaporizable or sublimable. The carrier may be a glass or glass-like substance. In some embodiments, the carrier may be permeable having one or a plurality of pores through which the bonding agent may escape when converted to a gaseous state with heat, pressure, light or other methods. A substrate is bonded to the carrier using the bonding agent. The substrate is then processed to form a membrane. This processing may include grinding, polishing, etching, patterning, or other steps. The processed membrane is then aligned and affixed to a receiving substrate, or a previously deposited membrane. Once properly attached, the bonding agent is then heated, depressurized or otherwise
(Continued)

caused to sublimate or vaporize, thereby releasing the processed membrane from the carrier.

37 Claims, 8 Drawing Sheets

Related U.S. Application Data

(60) Provisional application No. 62/238,930, filed on Oct. 8, 2015, provisional application No. 62/238,764, filed on Oct. 8, 2015, provisional application No. 61/868,765, filed on Aug. 22, 2013, provisional application No. 62/004,549, filed on May 29, 2014.

(51) Int. Cl.
| | |
|---|---|
| *B32B 38/10* | (2006.01) |
| *B32B 43/00* | (2006.01) |
| *B82Y 10/00* | (2011.01) |
| *H01L 21/683* | (2006.01) |

(52) U.S. Cl.
CPC ....... *B32B 2310/04* (2013.01); *B32B 2457/00* (2013.01); *B32B 2551/00* (2013.01); *H01L 2221/68327* (2013.01); *H01L 2221/68368* (2013.01); *H01L 2221/68381* (2013.01)

(56) References Cited

U.S. PATENT DOCUMENTS

| | | | |
|---|---|---|---|
| 5,459,351 | A | 10/1995 | Bender |
| 6,214,520 | B1 | 4/2001 | Wolk et al. |
| 7,262,444 | B2 | 8/2007 | Fillion et al. |
| 7,708,854 | B2 | 5/2010 | Kroninger et al. |
| 7,829,386 | B2 | 11/2010 | Fillion et al. |
| 7,884,032 | B2 | 2/2011 | Ye et al. |
| 7,901,532 | B2 | 3/2011 | Bain et al. |
| 7,993,969 | B2 | 8/2011 | Pohl et al. |
| 9,359,198 | B2 | 6/2016 | Fucetola et al. |
| 2003/0104170 | A1 | 6/2003 | Johnston et al. |
| 2004/0009649 | A1 | 1/2004 | Kub et al. |
| 2004/0171740 | A1 | 9/2004 | Ruberti et al. |
| 2008/0011416 | A1 | 1/2008 | DeMeter |
| 2009/0117437 | A1 | 5/2009 | Liu et al. |
| 2009/0266418 | A1 | 10/2009 | Hu et al. |
| 2010/0155936 | A1 | 6/2010 | Codding et al. |
| 2011/0171559 | A1 | 7/2011 | Zhang et al. |
| 2011/0297771 | A1 | 12/2011 | Noda et al. |
| 2013/0280885 | A1 | 10/2013 | Bayram et al. |
| 2013/0288454 | A1 | 10/2013 | Burggraf |
| 2014/0144593 | A1 | 5/2014 | Dang et al. |
| 2015/0053337 | A1 | 2/2015 | Fucetola et al. |
| 2015/0283798 | A1 | 10/2015 | Raymond |

FOREIGN PATENT DOCUMENTS

| | | |
|---|---|---|
| CN | 102420114 A | 4/2012 |
| JP | 1-208842 A | 8/1989 |
| JP | 3-44067 A | 2/1991 |
| JP | 10-4206 A | 1/1998 |
| JP | 2004-64040 A | 2/2004 |
| JP | 2005-191535 A | 7/2005 |
| WO | 2012/097830 A1 | 7/2012 |

OTHER PUBLICATIONS

Journal of Vacuum Science & Technology B, vol. 29(6), Sep./Oct. 2011, 06F401, pp. 06F401-1 through 06F401-3, "3D nanostructures by stacking pre-patterned fluid-supported single-crystal Si membranes", 5 pages, Ghadarghadr, et al.
Journal of Vacuum Science & Technology B, vol. 29(6), Nov./Dec. 2011, 06F402, pp. 06F402-1 through 06F401-3, "3D fabrication by stacking prepatterned, rigidly held membranes", 3 pages, Patel, et al.
European communication dated Mar. 17, 2017 in co-pending European patent application No. 14838653.5.
International Search Report and Written Opinion dated Feb. 15, 2017 in corresponding PCT application No. PCT/US16/53719.
DYMAX Corporation Product Data Sheet, "Multi-Cure 602-REV-A General Purpose Bonding Adhesive," 2012.
Japanese communication, with English translation, dated Mar. 6, 2018 in co-pending Japanese patent application No. 2016-536327.
Chinese communication, with English translation, dated May 24, 2017 in co-pending Chinese patent application No. 201480058147.4.
Chinese communication, with English translation, dated Feb. 12, 2018 in co-pending Chinese patent application No. 201480058147.4.
Philippine communication, dated May 4, 2018 in co-pending Philippine patent application No. 1/2016/500343.

CARRIER-SUBSTRATE ADHESIVE SYSTEM

This application claims priority of U.S. Provisional Patent Application Ser. No. 62/238,930 and 62/238,764, filed Oct. 8, 2015 and is also a continuation in part of U.S. patent application Ser. No. 14/459,879, filed Aug. 14, 2014, which claims priority of U.S. Provisional Patent Application Ser. No. 61/868,765 filed Aug. 22, 2013 and U.S. Provisional Patent Application Ser. No. 62/004,549 filed May 29, 2014, the disclosures of which are incorporated herein by reference in their entireties.

BACKGROUND

Three dimensional nanostructures have utility in various applications, such as photonic crystals with embedded devices, three-dimensional integrated semiconductor electronics, three-dimensional semiconductor memory, tissue scaffolds, graded-optical-index components, heterogeneous single-crystal lattice-mismatched structures and others.

In some embodiments, these three-dimensional nanostructures are fabricated by aligning and stacking pre-patterned membranes on top of one another or onto a receiving substrate. Typically, some of these membranes are patterned. This patterning may include the introduction of pores, channels, regions of implanted chemical elements, electronic or photonic devices, or other structures. Additionally, the patterning may include dividing the membrane into a plurality of disjoint portions.

Various techniques have been described to stack patterned membranes. For example, each membrane may be disposed on a frame. In such an embodiment, a membrane may be coupled to the outer frame through the use of cleavage points. The patterned membrane, with the attached frame, is aligned to a substrate or a previously deposited membrane. Once aligned, the cleavage points can be severed, thereby separating the frame from the membrane.

However, while this technique may be acceptable in certain applications, it may not be suitable for membranes with compressive stress or for disjoint membranes.

Therefore, it would be beneficial if there were an improved carrier system for transporting and aligning membranes to create three dimensional nanostructures.

SUMMARY

A system and method for creating three-dimensional nanostructures is disclosed. The system includes a substrate bonded to a carrier using a bonding agent that may be either vaporizable or sublimable. The carrier may be a glass or glass-like substance, silicon, another inorganic material, or may itself be a vaporizable or sublimable material. In other embodiments, the carrier may be sintered, an aerogel, or a capillary array. In some embodiments, the carrier may be permeable. For example, the carrier may have one or more pores through which the bonding agent may escape when heated or otherwise converted to a gas. A substrate, such as silicon, gallium arsenide, gallium nitride, graphene, or another material, is bonded to the carrier using the bonding agent. The substrate may then be processed to form a desired membrane. This processing may include grinding, dicing, polishing, patterning via lithographic means, etching, metallization or other means of patterning. The substrate or processed membrane, hereafter referred to as an article, is then aligned to a receiving substrate, or a previously deposited membrane. Once properly aligned, the bonding agent is then heated, depressurized or otherwise caused to sublime or vaporize, thereby releasing the substrate or processed membrane from the carrier. This process may be repeated a plurality of times to build a desired stack of membranes.

In one embodiment, a method of detaching an article attached to a carrier with a bonding agent is disclosed. The method comprises causing the bonding agent to transition from a solid to a liquid-state; and wicking the liquid-state away from a gap between the carrier and the article, in order to release the article from the carrier. In certain embodiments, the carrier is permeable. In some embodiments, the bonding agent transitions into the liquid-state via at least one of decomposition or melting. In some embodiments, the liquid-state of the bonding agent is at least partially stored within the permeable carrier. In some embodiments, the liquid-state of the bonding agent transitions to a gas and passes through the permeable carrier. In certain embodiments, the liquid-state of the bonding agent transitions to a gas and at least some of the gas collects in the permeable carrier in at least one of its liquid or solid states.

In another embodiment, a method of detaching an article is disclosed. The method comprises releasing the article from a bonding agent by transitioning the bonding agent from a solid by increasing the temperature or decreasing the pressure of the local or global atmosphere. In certain embodiments, the bonding agent is vaporizable or sublimable. In some embodiments, the bonding agent comprises a molecule having one or more cores and one or more handles to optimize at least one of the solvent solubility, chemical resistance, cohesion, adhesion, melting point, heat capacity and vapor pressure. In some embodiments, the bonding agent decomposes or is structurally modified into one or more sublimable or vaporizable species. In some embodiments, the bonding agent undergoes photo-initiated scission or change in conformation to one or more agents with higher vapor pressures. In certain embodiments, the bonding agent attaches the article to a carrier. In certain embodiment, the carrier is permeable. In certain embodiments, the permeable carrier comprises at least one of an aerogel, xerogel or other material produced from a soluble gel. In certain embodiments, the permeable carrier comprises at least one of a capillary array, frit, or porous fibrous material. In certain embodiments, the permeable carrier comprises at least one embedded structure that is not porous. In some embodiments, the embedded structure adjusts the thermal, electromagnetic, fluidic or mechanical properties of the permeable carrier.

In another embodiment, a method of processing a substrate to form a membrane is disclosed. The method comprises mixing together a first bonding agent having a first melting point and a second bonding point having a second melting point, higher than the first melting point, to form a bonding agent mixture; melting the bonding agent mixture; bonding a carrier to the substrate using the melted bonding agent mixture; causing the first bonding agent to be evaporated, sublimated or otherwise removed from the bonding agent mixture, leaving behind the second bonding agent; processing the substrate after the first bonding agent has been removed from the bonding agent mixture to form a membrane; and sublimating or evaporating the bonding agent mixture after the processing to remove the membrane from the carrier. In certain embodiments, a temperature at which the bonding occurs is lower than a temperature at which the membrane is removed from the carrier.

BRIEF DESCRIPTION OF THE FIGURES

For a better understanding of the present disclosure, reference is made to the accompanying drawings, which are incorporated herein by reference and in which.

DETAILED DESCRIPTION

A substrate is affixed to a carrier with a bonding agent and may then be processed to create a membrane. The substrate or membrane, referred to as an article, can then be stacked on top of a receiving substrate or other previously deposited articles to create a three-dimensional nanostructure.

Throughout this disclosure, reference is made to the attachment of substrates and the detachment of membranes from a carrier. However, it is noted that, in certain embodiments, the substrate, after being attached to the carrier, is not processed. For example, the carrier may be used to support the substrate, such as during transportation. Thus, while the disclosure describes embodiments where the substrate is processed prior to being detached, it is understood that in each of these embodiment, the article being detached may be the original substrate or a processed membrane.

Figure 1A:
FIG. 1A shows the carrier and substrate prior to attachment.
Figure 1A:
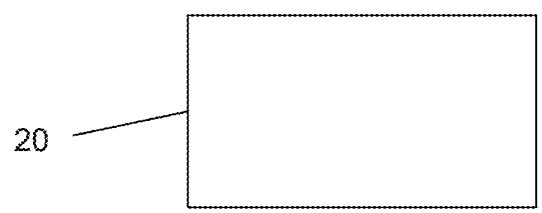

FIG. 1A shows a carrier 10 and a substrate 20 prior to processing. The carrier 10 may be any semirigid amorphous or crystalline material or composite. In some embodiments, the carrier 10 may be a flexible glass or similar material. The dimensions of the carrier 10 may vary. For example, its length and width may be based on the size of the membrane that is being created. In one embodiment, the carrier 10 may have a 25 mm diameter, although other dimensions are within the scope of the disclosure. The thickness of the carrier 10 may also be varied, but in some embodiments, may be between 0.1 mm and 10 mm, although other thicknesses are also possible.

Figure 5:
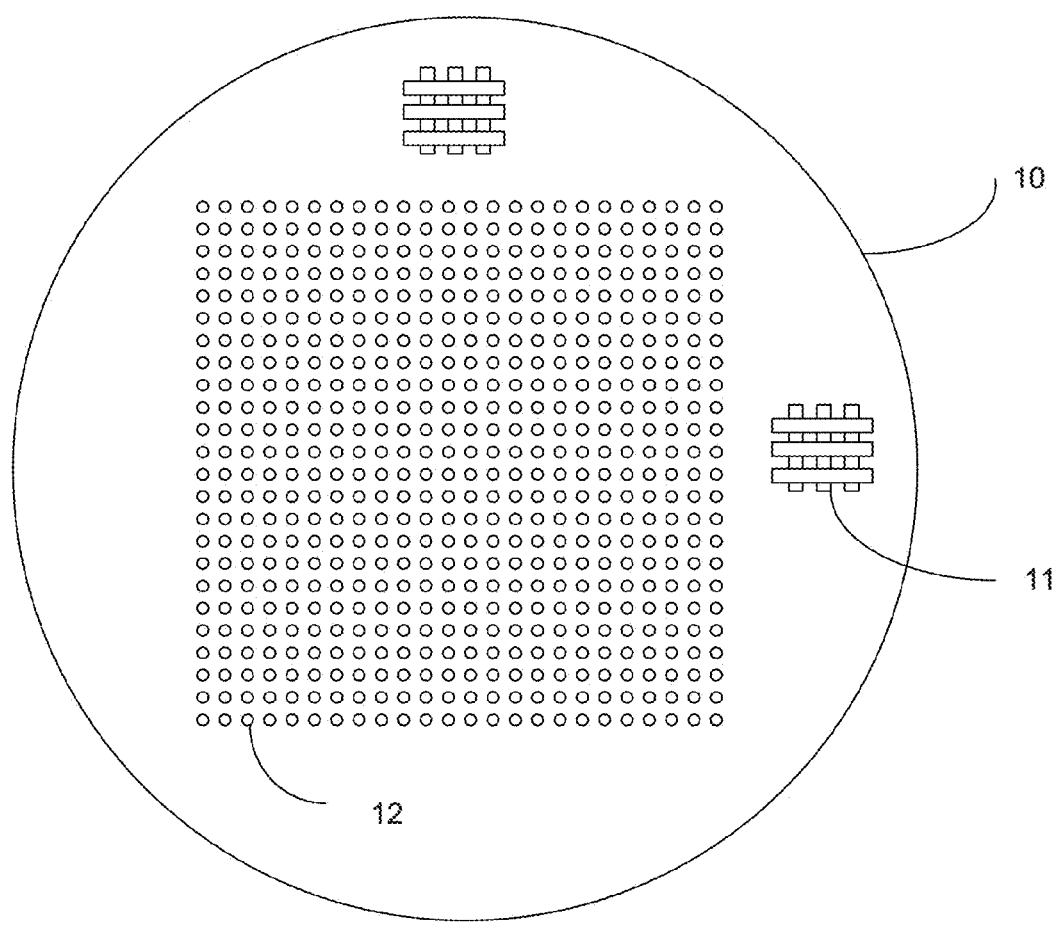
FIG. 5 shows a porous carrier in accordance with one embodiment.
Figure 6:
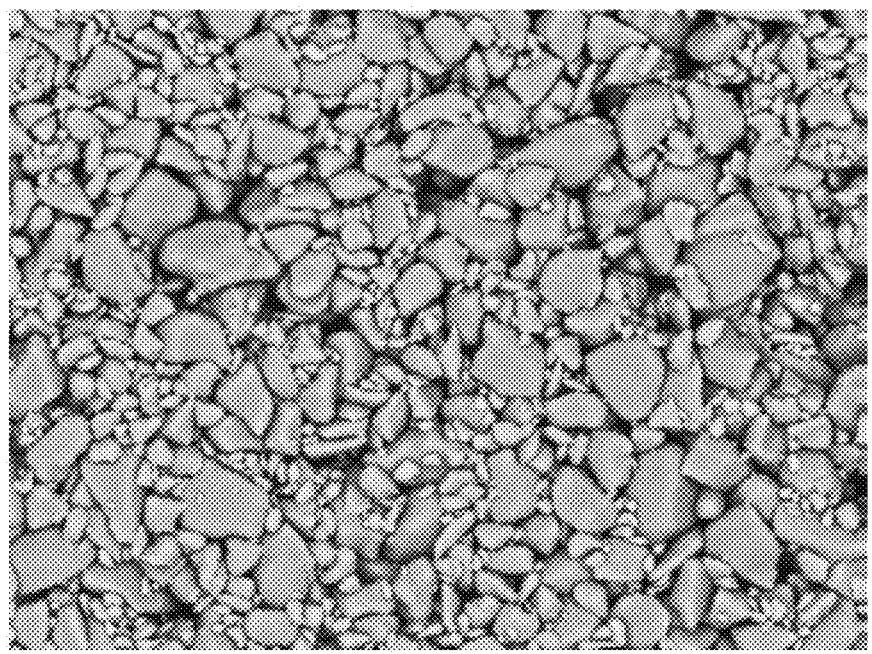
FIG. 6 shows a close-up view of a material that may be used as a carrier in accordance with one embodiment.

In some embodiments, the carrier 10 may be permeable. In one embodiment, the permeability of the carrier 10 may be greater than $1 \times 10^{-12}$ millidarcy. The permeable carrier 10 may be of various construction and material. For example, in one embodiment, the carrier 10 contains one or more pores 12 that extend through the thickness of the carrier 10, as shown in FIG. 5. These pores 12 may have a diameter in the range of nanometers to hundreds of micrometers, although this diameter may vary. The porosity of the carrier 10 may be greater than 20%. In some embodiments, the porosity is greater than 50%. The purpose of the pores 12 will be described in more detail below.

In another embodiment, the carrier 10 is porous by virtue of being composed of a material that comprises particles that contact one another only at limited points, leaving pathways between particles large enough to enable gases to pass through the carrier. For example, FIG. 5 shows a view of such a material, which, in this embodiment, is sintered glass. FIG. 5 shows a close-up view of the material so that the pathways between the particles are visible. Of course, other materials that include pathways between particles or molecules may be used, and the disclosure is not limited to this or any other particular material.

In another embodiment, the carrier 10 may be made out of one or more sublimable or vaporizable materials. In this embodiment, the carrier may be affixed directly to the substrate without any intervening layers of bonding agent. In one embodiment, the carrier material is melted to attach it to the substrate. In one embodiment, the carrier material is vaporized and condenses onto the substrate. By coating the substrate, the carrier encases some or all of the surface of the substrate, which may be patterned with protruding and/or recessed structures. The article, which may be a substrate or a membrane, benefits from the support of the vaporizable or sublimable bonding agent during subsequent processing steps as some of these bonding agents form hard crystalline solids.

In another embodiment, the carrier 10 may be made of a material that is permeable without having pores and pathways. For example, materials such as polydimethylsiloxane (PDMS) are permeable to gas. Of course, other materials may also have this property and the disclosure is not limited to any particular material.

To achieve the properties described above, the permeable carrier 10 may be made from various materials, including papers, aerogels or similar materials, capillary arrays, frits and porous polymers. Moreover, a solid material may be made into a permeable carrier by machining holes and/or surface channels that facilitate transport of the bonding agent. Generally, papers comprise strands of fiber, typically cellulose or glass. Aerogels, xerogels or other materials produced from a sol-gel process comprise veins of residue from a gel matrix that remain after liquids are removed. Capillary arrays comprise one or more channels that pass into and through a solid body, including the case where the channels occur along and through material surfaces. Frits comprise particles that are sintered together. Each of these materials is described in more detail below.

The permeable carrier 10 may include embedded structures that are not porous. These embedded structures may be used to adjust the thermal, electro-magnetic, fluidic or mechanical properties of the carrier. One example is an embedded heating element that allows regions of the carrier to be selectively heated. Another example is the inclusion of fracture-points or embedded features to facilitate sectioning the stack (which may include the combination of the substrate, bonding agent and carrier) into dies or other subdivisions.

As noted above, papers are porous fibrous materials that are permeable to liquids and gases. Their fibrous composition makes them more compliant than other carrier types, making them ideal in carriers for some applications. The ability of paper to wick fluids by capillary action may also be advantageous for some applications.

Aerogels, xerogels and other materials produced from a sol-gel or sol-gel-like process are porous materials formed by mixing, catalyzing and heating chemicals. Throughout the curing process, the gel sets and dries to form the porous material. Carriers made from aerogels may be manufactured in several ways.

One manufacturing process is to mold individual carriers. Aerogels can contain gradients in pore size and porosity. The gradient may be sharp, going from small pores near the surface of the material to larger pores in the bulk. This gradient modifies the capillarity and fluid flow properties of the aerogel.

A second manufacturing process is described below. Instead of forming individual carriers, the aerogel process can be used to create a 'boule' that is generally cylindrical, which provides a more even aspect ratio. Then, once cured, a wire saw or another slicing tool could be used to section the aerogel boule into wafer-thin slices that can be further polished flat into aerogel carriers.

Capillary arrays are porous materials comprising many adjacent channels through the bulk of the material, which are typically formed by, etching, ultrasonic drilling, powder-blasting, or laser-direct patterning. Generally, the pores have an inlet and outlet diameter that may not be equal and the pore shape and size may vary along its length. The permeability of these materials may be directly calculated from Darcy's Law, or Poiseuille's law when the pore cross-sections remain sufficiently uniform along the direction of flow.

Frits are porous materials comprising a fine powder of material, typically glass, metal, organic or inorganic powder, held together by a binder. The binder is dissolved in a solvent. The dissolved binder and powder are mixed into a paste and then cast into a form. Once cast, the solvent is desiccated away or otherwise removed to create a green frit. The term 'green' is used to denote that the material has not yet been subjected to thermal treatment. The green frit is then heat-treated or annealed to cause the binder to melt and join together the powder into a porous block of material. Frits may keep their form better than an aerogel, are often easier to form and mold than the aerogels and are commercially available at large scales.

Lastly, polymers and elastomers are another class of materials that may be used as a permeable carrier. These materials can be tailored in their permeability and stiffness but are limited in their maximum temperature.

Thus, the term "permeable carrier" refers to any material that allows the passage of the liquid-state or gaseous form of the bonding agent. This permeability may be achieved in a variety of ways; some of which are described above. However, other permeable carriers are also within the scope of the disclosure.

The substrate 20 may be any suitable material or composite, and may be a semiconductor material. In some embodiments, the substrate may already contain patterned microstructures. In certain embodiments, the substrate 20 may be a silicon substrate. The dimensions of the substrate 20 before processing may vary. In some embodiments, the substrate 20 is of a size that is convenient to handle and is not susceptible to breakage. For example, in some embodiments, the diameter of the substrate 20 before processing may be about 1 cm. In some embodiments, the substrate 20 may be much larger, measuring tens of centimeters across. The thickness of the substrate before processing may be about half a millimeter, although it can be thicker or thinner.

Figure 1B:
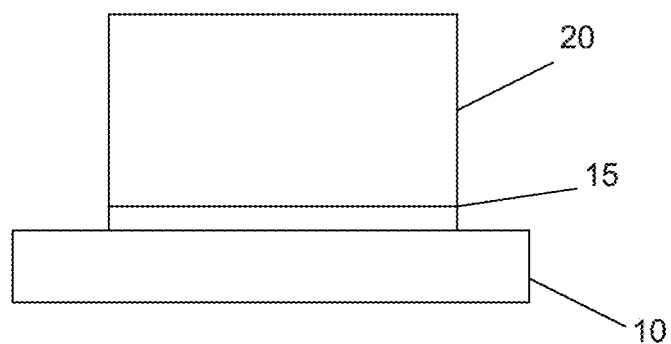
FIG. 1B shows the substrate bonded to the carrier.

The substrate 20 is then affixed to the carrier 10 using a bonding agent 15, as shown in FIG. 1B. This bonding agent 15 may be an adhesive, or a plurality of adhesive layers, that is vaporizable or sublimable. The term "vaporizable" is used to designate materials that can readily make a transition to the gaseous state. The term "sublimable" is used to designate materials that can transition directly from the solid state to the gaseous state without first melting. In one embodiment, a liquid bonding agent, when heated, depressurized or otherwise stimulated, transitions into a gaseous phase. In another embodiment, a solid bonding agent, when heated, depressurized or otherwise stimulated, transitions by first melting into a liquid and then evaporating into a gaseous phase. In another embodiment, a solid bonding agent, when heated, depressurized or otherwise stimulated, sublimates directly into a gaseous phase.

There are different classes of bonding agent 15 that may be used to detach a permeable carrier 10 from an article, which may be a substrate 20 or a processed substrate, referred to as a membrane. In the first class, the bonding agent molecule releases the article from the permeable carrier 10 through direct sublimation or vaporization. In the second class, the bonding agent molecule decomposes or is structurally modified into one or more volatile, sublimable or vaporizable species, which may then be vaporized or sublimated, in part or in whole. In the third class of materials, the bonding agent molecule undergoes a photo-initiated scission or change in conformation to form one or more bonding agents with higher vapor pressures that are more readily sublimated or vaporized. Each class is described in more detail below.

Within the first class, the bonding agent 15 may comprise a molecule having a "core" and a side group or "handle". The "core" molecule most significantly affects the material cohesion, which is the bond between molecules, and standard vapor pressure, which is the vapor pressure at 25° C. The side group or "handle" most significantly affects the adhesion to the carrier and to the substrate. Some examples of core molecules are naphthalene or pentacene; while some examples of handle molecules are hydroxyl or carboxyl groups. Of course, other "core" molecules and "handles" may be used as well.

Figure 7:
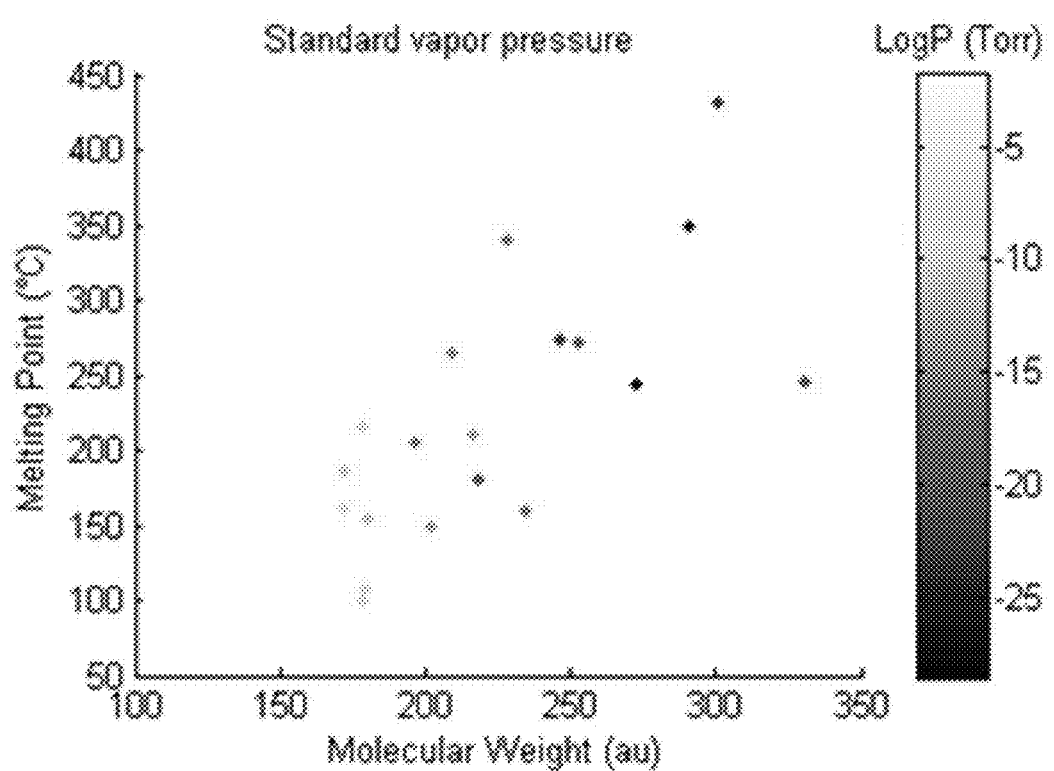
FIG. 7 compares the melting point and standard vapor pressure for various possible bonding agents.

The choice of core molecule and side group is an important feature of bonding agent design that affects material/process compatibility. Different core molecules have different melting points, solubility, chemical resistance and stability making them robust to different processes. The vapor pressure, and hence release process, is affected somewhat by choice of side group; a larger core mass reduces the vapor pressure and increases melting point. This is shown in FIG. 7, which compares the melting point and standard vapor pressure for several potential bonding agents. Thus, the selection of the core and handles may optimize at least one of the solvent solubility, chemical resistance, cohesion, adhesion, melting point, heat capacity and vapor pressure.

The flexibility of the core molecule and side group system can be used to think more broadly about how to modify the system to convert the molecule from a low-vapor pressure, high molecular weight and high melting-point material into a high-vapor pressure, low molecular weight material. Below are two such mechanisms.

The second class of bonding agents includes those that decompose or are structurally modified into one or more volatile, sublimable or vaporizable species. For example, in the case of 1-pyrenecarboxylic acid, it is observed that the material sublimates with a rough vacuum at 206° C. and begins smoking in atmosphere at 235° C., where its theoretical vapor pressure is 0.56 Torr, which is less than 1 atmosphere. It is believed that the material is undergoing a thermally-induced decarboxylation, leading to species of pyrene, 1-hydroxypyrene, carbon monoxide and carbon dioxide. The corresponding vapor pressures of pyrene and 1-hydroxypyrene are around 1E4 Torr and 9E3 Torr at 235° C., both of which are greater than 1 atm.

The third class includes those in which the bonding agent molecule undergoes a photo-initiated scission or a structural/conformational change to form one or more high-vaporpressure bonding agents that are sublimated or vaporized under different thermodynamic conditions.

For example, in the case of polymers, photo-scission of ester bonds is used to weaken polymethylmethacrylate (PMMA) to allow it to be preferentially removed from unexposed regions of photoresist. Instead, a molecule that has a photo-switchable side group or linkage may become more easily sublimated upon or after illumination with light. This is distinct from the case in which light is used to heat and vaporize a material; instead, in the present disclosure, the molecular structure of the bonding agent is changed prior to vaporization or sublimation, which occurs due to the mechanism described herein.

Figure 8:
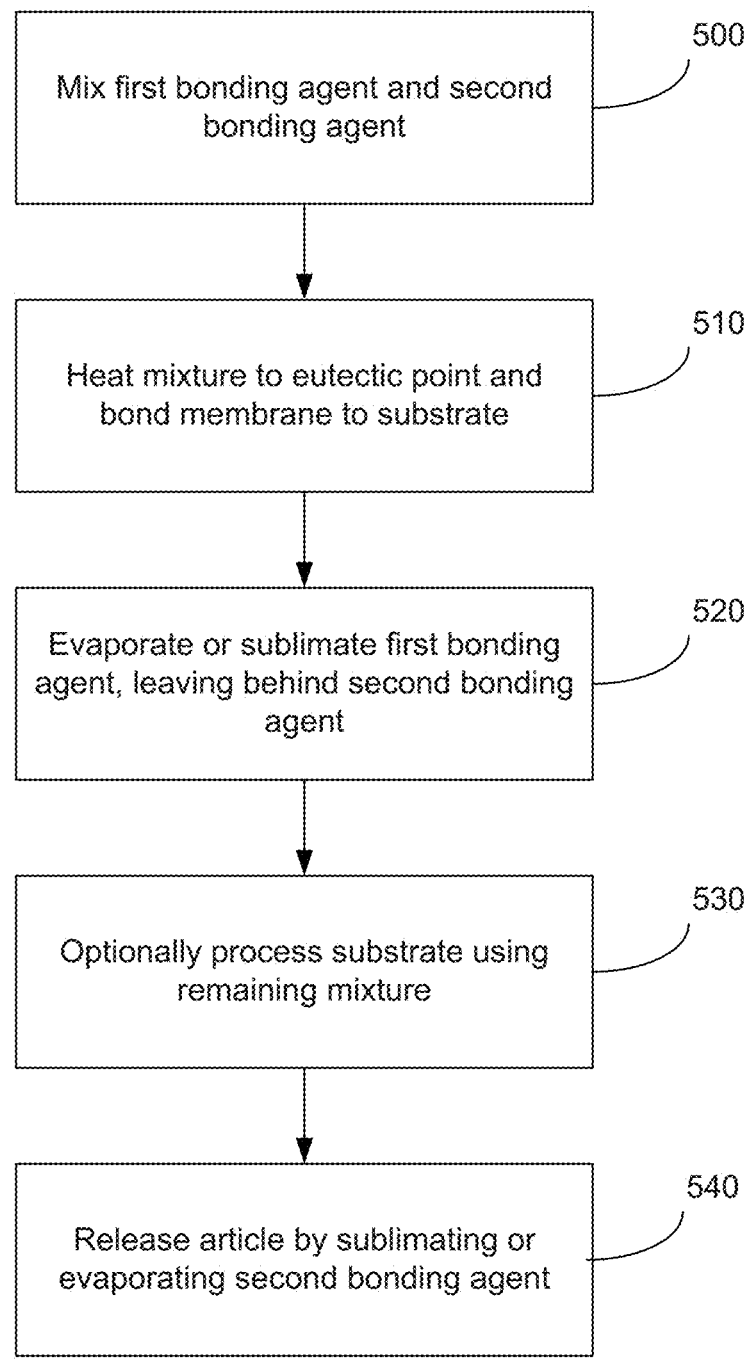
FIG. 8 shows a flowchart showing the use of a mixture of bonding agents.

In another embodiment, two or more bonding agents 15 may be mixed together. For example, a first bonding agent having a first melting point and a second bonding agent having a second melting point, higher than the first melting point, may be mixed together. The constituents in the mixture may be combined in a ratio to create the lowest possible melting point, or eutectic point, that can be lower than the melting point of the first bonding agent. FIG. 8 shows how a mixture of this first bonding agent and second bonding agent can be used in the processing of a substrate. First, as shown in Process 500, the first bonding agent and the second bonding agent are combined to form a bonding agent mixture. This mixture is heated to its eutectic point where it becomes a liquid. This eutectic point may be lower than the first melting point, thereby reducing the thermally-induced stress applied to the substrate 20 during the bonding process. Once the mixture is melted, it is used to bond the permeable carrier 10 to the substrate 20, as shown in Process 510. Once the substrate 20 is bonded to the permeable carrier 10, the first bonding agent may be evaporated, sublimated, removed by use of a solvent or otherwise partially eliminated from the mixture, thereby leaving mostly the second bonding agent behind, as shown in Process 520. In other words, the first bonding agent has a lower vapor pressure than the second bonding agent and can therefore be removed without removing the second bonding agent. The substrate 20 may optionally then be etched, thinned, handled, stacked, assembled or otherwise processed while bonded to the permeable carrier 10, as shown in Process 530. As explained above, at this point, the permeable carrier 10 and the substrate 20 are bonded together mostly by the second bonding agent. The article, which may be substrate 20 (if no processing was done) or a membrane, is then released from the permeable carrier 10 by sublimating or evaporating the remaining mixture, as shown in Process 540.

One benefit of this approach is that there is less stress in the substrate since bonding occurs at a lower temperature. Removal of the first bonding agent leaves the more robust second bonding agent while the substrate optionally undergoes additional processing. While the eutectic point is a known parameter of a mixture, using it and then preferentially removing one element of the mixture provides the ability to decouple the melting point from the debonding point.

Further, this approach can be used to design a mixture that has a specific melting point. In other words, the bonding agents may be selected to achieve a melting point that is between the eutectic point and the greatest of the melting points of the constituent bonding agents. In another embodiment, a mixture of two or more bonding agents may be tailored to have a specific melting point that is greater than or equal to the eutetic point. Some processes would both benefit from the low-stress bonding at a low temperature while maintaining a higher melting point of the mixture.

Another feature of a bonding agent mixture is that the lower melting-point bonding agent, when molten, can act as a solvent to both sublimable bonding agents and/or higher melting-point vaporizable bonding agents. For example, pentacene, which decomposes before melting, has been observed to dissolve readily into molten naphthalene.

Furthermore, bonding agent mixtures can also be used to detach articles from carriers in such a way that a small amount of vaporizable or sublimable residue is left behind to prevent the sticking action of Van der Waals. This residue is later removed by evaporation, sublimation or other cleaning steps. For example, an article stacked on a receiving substrate may be left with a residue that is readily sublimable at a higher temperature or lower pressure than that used during the detachment process. This cleaning step can occur later in the processing after the article, which may be a substrate or membrane, has been sufficiently bonded to the receiving substrate.

Furthermore, while FIG. 8 shows the process using two bonding agents, the disclosure is not limited to this embodiment. Three or more bonding agents may also be combined, and moreover, bonding agents from within the different classes above may be combined together as part of this invention.

The bonding agent 15 may be applied to the carrier 10 or article in a number of different ways, such as evaporation, spin coating and drop casting. In another embodiment, a soluble gel (sol-gel) may be cured on an article that was pre-coated with the bonding agent 15. Other techniques may also be used and are not limited by the disclosure.

Figure 2A:
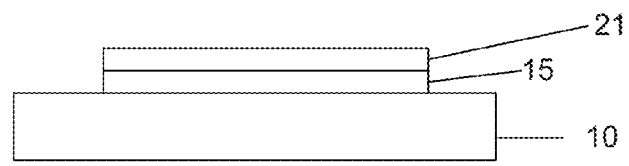
FIG. 2A shows a membrane bonded to the carrier after grinding.

Once the substrate 20 is affixed to the carrier 10 using the bonding agent 15, the bonding agent 15 may solidify. The substrate 20 may optionally then be processed. The substrate 20 may be thinned to reduce its thickness. For example, the substrate 20 may be ground and polished so as to reduce its thickness, as shown in FIG. 2A. In another embodiment, the substrate 20 may be exfoliated to cleave thin membrane layers from the substrate. In another embodiment, the substrate 20 may be etched to form a membrane of the desired thickness. When the thinning process is completed, the substrate 20 may have a thickness of about 300 nm, although other dimensions are also possible. The substrate 20, once thinned, may be referred to as a membrane 21. In other embodiments, the substrate 20 is not processed and remains unaffected throughout the process.

In certain embodiments, the membrane 21 may be further processed, if desired. For example, a process of lithography and etching may be used to create a pattern on the membrane 21, as shown in FIG. 2C. This patterning may be used to create structures of various types in the membrane 21, or may be used to separate the membrane 21 into a plurality of disjoint portions 22, as shown in FIG. 2C. For example, the substrate may be further processed to create a pattern or complex microstructures within or on the membrane. These microstructures may include electronic, mechanical and photonic devices. The types of microstructures that may be created are not limited by this disclosure.

Figure 2B:
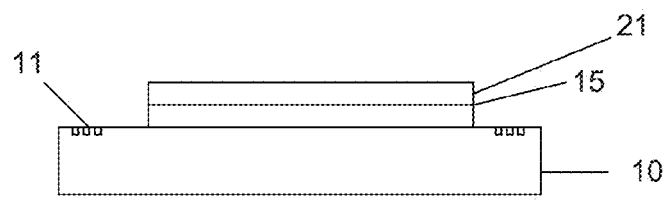
FIG. 2B shows the membrane of FIG. 2A after patterning.
Figure 2C:
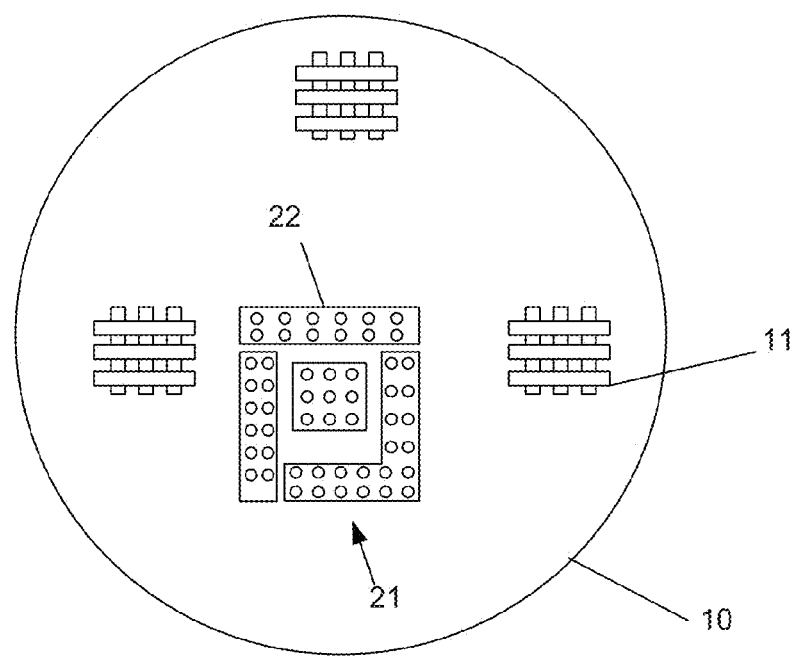
FIG. 2C shows a top view of the membrane of FIG. 2B.

Additionally, while the membrane 21 is being patterned with its microstructures, the carrier 10 and/or membrane 21 may also be patterned to create alignment marks 11, as shown in FIGS. 2B and 2C. In this embodiment, the alignment marks 11 are created to have a known spatial relationship with respect to the patterning of the membrane 21. These alignment marks 11 serve to align the patterned membrane 21 with respect to the receiving substrate, as described in greater detail below.

In another embodiment, the alignment marks 11 may already be present on the carrier 10 prior to the processing of the article or the patterning of the membrane 21. In such an embodiment, the processing of the article or patterning of the membrane 21 may be performed using the pre-existing alignment marks 11 as a guide. In other words, the patterning is performed in such a way so as to be aligned with respect to the pre-existing alignment marks 11.

As shown in FIGS. 2B and 2C, the alignment marks 11 may be etched into the carrier 10. However, in other embodiments, the alignment marks 11 may be disposed on the carrier 10 in other ways, for example as a relief pattern or as a metallic pattern. The alignment marks 11 may also be disposed on or etched into disjoint portions 22.

In some embodiments, the alignment marks 11 are created so as to be able to align the carrier 10 to the receiving substrate in at least one direction.

A three-dimensional structure is constructed on a receiving substrate. This receiving substrate may have alignment marks that are intended to align with the alignment marks 11 on the carrier 10, as described below.

Figure 3A:
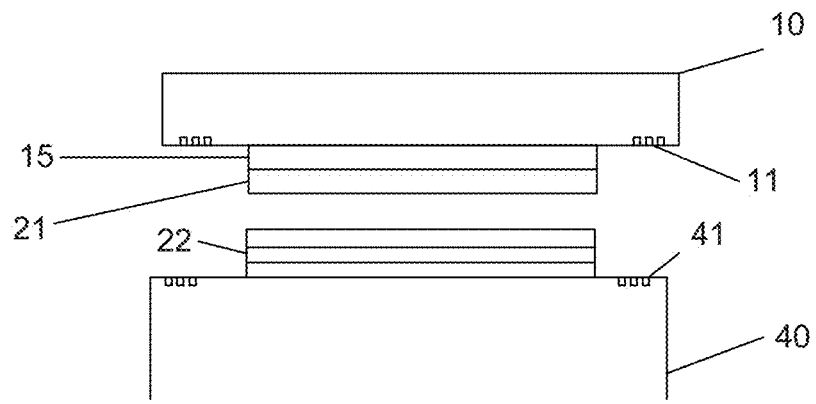
FIG. 3A shows the membrane and carrier of FIG. 2B as it is aligned to a receiving substrate.

FIG. 3A shows a receiving substrate 40 having a stack 23 of articles already disposed thereon. The receiving substrate 40 also has alignment marks 41, which align to the carrier 10.

Each article, which may be a substrate 20 or a membrane 21, is deposited on the receiving substrate 40 as follows. First, the substrate 20 is affixed to the carrier 10 using a bonding agent 15. The substrate 20 is then optionally thinned and processed to create the membrane 21 and any patterns thereon or therein. In other embodiments, no processing of the substrate 20 is performed. As described above, alignment marks 11 are disposed on the carrier 10 to have a fixed and known spatial relationship with respect to the pattern on the membrane 21. The alignment marks 11 may either be created during the membrane patterning process, or may pre-exist.

The carrier 10 is then transported and disposed proximate to the receiving substrate 40, as shown in FIG. 3A. In one embodiment, the carrier 10 is disposed with the article, which may be a substrate 20 or a membrane 21, oriented downward above the receiving substrate 40. The carrier 10 is then aligned to the receiving substrate 40, using alignment marks 11 and 41. As described above, in some embodiments, the alignment marks 11 and 41 allow alignment in at least one direction. In this scenario, the carrier 10 may be capable of movement in all six degrees of freedom, including three translation axes and two rotation axes. In other embodiments, alignment may be performed in fewer directions. For example, in one embodiment, the alignment marks 11, 41 allow alignment in at least one direction.

Alignment may be performed in a number of ways. In some embodiments, an optical alignment process, shown as those known in the art, is used to align the carrier 10 to the receiving substrate 40. Of course, other methods of alignment may also be used.

The carrier 10 is then moved so that the article, which may be a substrate 20 or a membrane 21, contacts the receiving substrate 40. In the case where a stack 23 of one or more membranes 21 have already been placed on the receiving substrate 40, the new membrane 21 is lowered onto the existing stack 23 of membranes (see FIG. 3A). While FIG. 3A shows the membrane 21 being lowered onto the receiving substrate 40, other embodiments are possible. For example, the carrier 10 may be disposed beneath the receiving substrate 40 and lifted to deposit the membrane 21 on the receiving substrate 40. Any orientation of the carrier 10 and receiving substrate 40, which allows the carrier 10 to be positioned and aligned relative to the receiving substrate 40 so that the membrane 21 can be detached from the carrier 10 and deposited onto the receiving substrate 40 is within the scope of this disclosure.

The membrane 21 may be attached to the receiving substrate or the stack 23 by optionally using surface-to-surface contact bonding, so-called Van der Waals bonds, followed by additional thermal processes, e.g. thermal or laser annealing or quasi-covalent bond formation, that improve the attachment of the membrane 21 to the receiving substrate 40. In one embodiment, when annealing silicon membranes 21 in contact with one another above 300° C. for several minutes, quasi-covalent bonds may form between the contacting membranes 21. In another embodiment, an adhesive may be used to affix the membrane 21 to the receiving substrate 40 or the stack 23 of membranes. In other embodiments, solder bumps may be used to connect vias or other metal conductors in adjacent membranes 21.

Figure 3B:
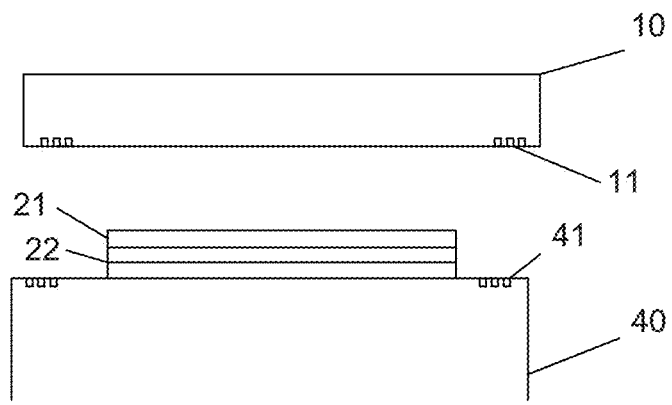
FIG. 3B shows the nanostructure created after membrane is stacked.

Once the membrane 21 is properly positioned, the bonding agent 15 is then removed from between the membrane 21 and the carrier 10. This may be done by heating the bonding agent 15 so that it vaporizes or sublimes. Alternatively, the pressure of the local atmosphere may be lowered so as to accelerate the process of vaporization or sublimation. In some embodiments, the bonding agent 15 may be otherwise stimulated. For example, electromagnetic radiation, such as light, may be used to vaporize or accelerate the sublimation of the bonding agent 15. Any combination of mechanisms that causes the bonding agent 15 to change from a solid to a gas may be used to remove the bonding agent 15. The elimination of the bonding agent 15 causes the membrane 21 to separate from the carrier 10 and become stacked on the receiving substrate 40, as shown in FIG. 3B. Again, while the above disclosure describes the detachment of a membrane 21, the process is equally applicable to an unprocessed substrate 20.

Pores 12 (see FIG. 5) in the carrier 10 allow the gas created by the vaporization or sublimation of the bonding agent 15 to pass through the carrier 10 easily. Without pores 12, the formation of the gaseous phase of the bonding agent 15 is impeded; any gases that form may not be fully removed and remain trapped between the carrier 10 and the membrane 21, which may be an undesirable outcome.

Examples of vaporizable bonding agents include naphthalene, although other bonding agents may be used.

Vapor from a vaporizable bonding agent 15 may condense and create surface tension that inhibits or makes more difficult the separation of the membrane 21 or substrate 20 from the carrier 10. The use of a sublimable adhesive eliminates the possibility of vapor condensing between the carrier 10 and the membrane 21 or substrate 20 since sublimation is a direct conversion from solid to gas.

In some embodiments, a sublimable bonding agent may be used. The sublimable bonding agent may be naphthalene, anthracene, tetracene or pentacene. In some embodiments, any polyaromatic hydrocarbon having a sublimation point lower than its melting point may be used. Other bonding agents may also be sublimable and the disclosure is not limited to the above list.

Figure 4:
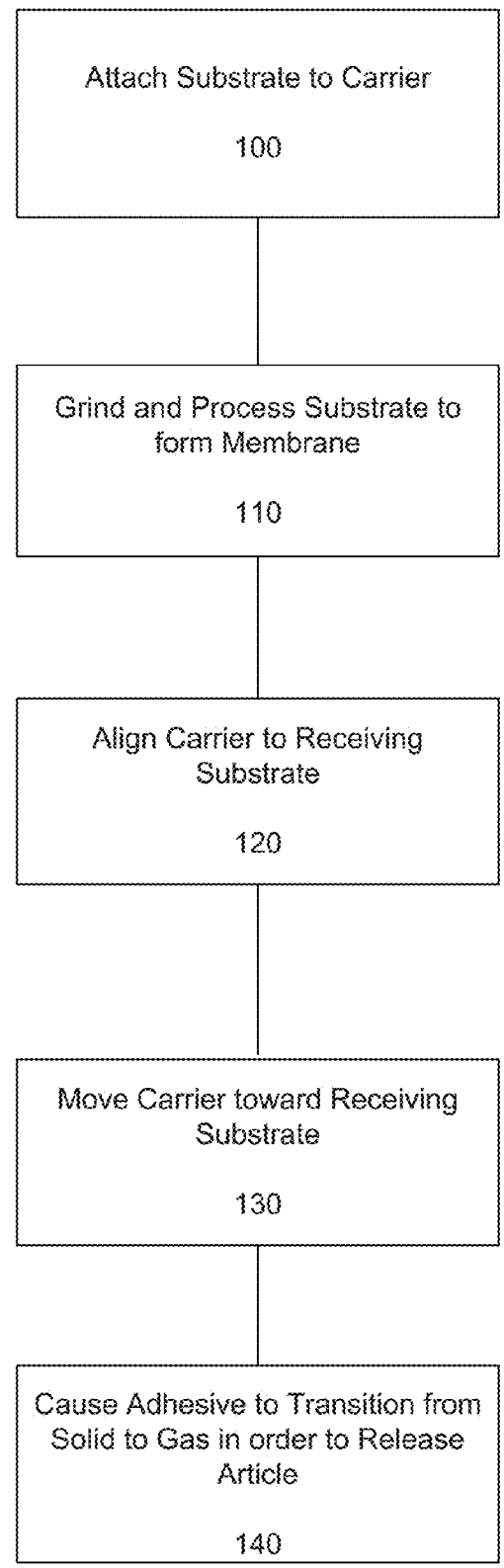
FIG. 4 shows a flowchart in accordance with one embodiment.

FIG. 4 shows a process flow showing the creation of a 3 dimensional nanostructure. First, as shown in process 100, a substrate to be optionally processed is attached to a carrier. The substrate to be processed is attached using a vaporizable or sublimable bonding agent. As described above, the substrate to be processed may be a semiconductor, such as silicon.

After the substrate to be processed has been attached to the carrier, it is optionally thinned and/or processed, as shown in process 110. In one embodiment, the substrate is ground and polished to reduce its thickness to a desired thickness. In another embodiment, the substrate may be exfoliated to cleave thin membrane layers from the substrate. In another embodiment, the substrate may be etched to form a membrane of the desired thickness. Other means of thinning the substrate to form a membrane are within the scope of this disclosure. Additionally, the substrate may be further processed to create a pattern or complex microstructures within or on the membrane. The types of microstructures may include electronic, mechanical and photonic devices and are not limited by this disclosure. The type of processing that is carried out to create patterns and microstructures on the substrate or the membrane is not limited by this disclosure. In certain embodiments, the substrate is not processed. In these embodiments, process 110 may be omitted.

After the substrate has been thinned and/or processed in other ways, it may be referred to as a membrane. This membrane remains affixed to the carrier by the bonding agent applied in process 100. The carrier with the processed membrane is then aligned to a receiving substrate, as shown in process 120. To do this, the carrier may be oriented so that the membrane is affixed to the bottom surface of the carrier. As stated above, in other embodiments, the receiving substrate is disposed above the carrier and the membrane is affixed to the top surface of the carrier. Any orientation in which the membrane is affixed to the carrier and is disposed between the carrier and the receiving substrate may be employed.

The carrier is then moved proximate to the receiving substrate. At least one of the carrier and the receiving substrate is moved relative to the other to achieve alignment. The carrier and the receiving substrate may both contain alignment marks to facilitate the alignment process. Alignment may be performed using a vision system or some other system.

While aligned, the carrier is moved toward the receiving substrate, as shown in Process 130. Surface-to-surface contact bonding, often called Van der Waals bonding, may be used to attach the membrane affixed to the carrier to the receiving substrate or to a previously attached membrane of a stack of membranes. Permanent adhesives and other adhesion-promoting materials may also be used during this attachment process. An anneal process may also be used to allow covalent bonds or quasi-covalent bonds to form between the membrane and the receiving substrate or another processed membrane. In some embodiments, the anneal process is performed after each membrane is added to the stack of membranes. In other embodiments, the anneal process is performed after the stack has been completed.

Once bonding between the article attached to the carrier and the receiving substrate, or between the article attached to the carrier and an article located on the receiving substrate, has occurred, the bonding agent is then caused to transition from a solid to a gas, as shown in Process 140. This may be through vaporization or sublimation. This may be done using pressure, temperature and/or electromagnetic radiation. The pressure may be changed globally, meaning that the carrier-adhesive-membrane system is enclosed in a de-pressurized chamber, or locally, meaning that at least a portion of the carrier-adhesive-membrane system is mounted to a de-pressurized chamber. The temperature may be changed locally or globally as well. The bonding agent, now in the form of a gas, may escape into and/or through pores in the carrier or into and/or through channels and pores in the article, facilitating the separation of the article from the carrier. In other embodiments, the gas escapes through the carrier, even though the carrier may not contain pores. In other embodiments, the carrier itself may be vaporized or sublimated away.

In one embodiment the carrier can then be used again to process another substrate into a membrane, allowing the processes 100-140 of FIG. 4 to be repeated. In another embodiment the carrier itself is disposable and thus discarded or vaporized. While a first article may be deposited directly on a receiving substrate, subsequent articles may be deposited on or next to the previously attached article, thereby allowing a three dimensional structure to be constructed. The anneal process described above may facilitate the bonding of adjacent articles to one another.

In certain embodiments, the above disclosure describes a solid bonding agent, which, when heated, depressurized or otherwise stimulated, transitions to a gas by first melting, decomposing or dissolving into a liquid and then evaporating into a gaseous phase.

In certain embodiments, it may be advantageous for the permeable carrier 10 and/or article to have the ability to wick the liquid-state of the bonding agent 15 away from the gap between the carrier 10 and the article as the bonding agent 15 melts. The liquid-state of the bonding agent 15 can be achieved by melting the bonding agent, though liquids formed by decomposition of one or more bonding agents and dissolution of one or more bonding agents within the molten state of another bonding agent are also possible. One mechanism to remove the bonding agent 15 from the gap between the article and carrier 10 is to wick the liquid-state of the bonding agent 15 into the carrier 10. This readily occurs when the gap between the article and the carrier 10 is of the same order of magnitude or greater than the characteristic length scale of the carrier pores so that the capillarity of the carrier 10 meets or exceeds the surface energies of the menisci between the carrier 10 and article. In other words, as the bonding agent 15 transitions to a gas, the permeable carrier 10 or article may wick the liquid-state of the bonding agent 15 away from the gap between the carrier 10 and article in whole or in part. The liquid-state of the bonding agent 15 may then evaporate and pass into and/or through the carrier 10 or into and/or through the article.

While liquids are known to wick into a permeable carrier, the pore structure that is optimal for debonding is not obvious. In one embodiment, the pore structure has a small characteristic length and correspondingly high capillarity but is flowrate-constrained due to viscous loss. In another embodiment, the pore structure length-scale is large, supporting higher flowrates, but the capillary force may not be strong enough to fully wick away the bonding agent. In another embodiment, the void volume of the carrier is sufficiently high that it acts as a collection vessel such that the bonding agent can be made to vaporize or sublimate at the article side and collect in the bulk or along the back surface due to a thermal or pressure gradient within the carrier 10. In another embodiment, the pore structure has several length scales, giving rise to higher porosity and capillarity, making it more suitable to debonding articles whose patterned surface area is large. In another embodiment, the carrier swells as its pore structure absorbs the bonding agent which allows the carrier to deflect away from the article during the debonding process.

If the liquid-state of the bonding agent 15 wets at least the carrier 10 or the article, then the capillary forces in at least the carrier 10 or the article may be large enough to draw the liquid-state of the bonding agent 15 away from the region between the article and carrier 10 into at least the pores of the carrier 10 or the surface of the article. With sufficient porosity (ratio of void volume to total volume), the carrier 10 or article may be used to store a majority or the entirety of the liquid-phase of the bonding agent 15. A typical open-area fraction for a capillary array is on the order of 20%. In contrast, the porosity of a porous network can be upwards of 95%, or roughly five times greater. In the first example, the required absorption thickness of the carrier, i.e. the required carrier thickness to fully absorb a given layer thickness of bonding agent, is thus approximately 5 times thicker than in the second example. For applications that require a thick layer of bonding agent and a thin carrier, a high porosity carrier may be desirable; for applications that demand a thin layer of bonding agent, a capillary array may be sufficient to collect the bonding agent.

In one embodiment, a carrier 10 may absorb the bonding agent 15 through convection or diffusion. Polydimethylsiloxane (PDMS), for example, can absorb naphthalene and is permeable to gases. A PDMS carrier that was bonded to a silicon substrate was found to absorb the bonding agent as it vaporized, which caused the PDMS to swell away from the substrate. After debonding the substrate, the PDMS carrier was cooled, and the bonding agent became visible as it solidified. Thus, in this embodiment, the carrier acts as a collector of the vaporized bonding agent. In other words, the bonding agent vaporizes into the carrier 10, but not necessarily through the carrier 10. Furthermore, the carrier may act as a storage medium for some or all of the bonding agent.

It is known that liquids permeating a porous material can be blocked by entrapped gases within the pores. This phenomenon is known as vapor lock. Imbibition of a liquid is defined as the ratio of void volume of the porous material to the volume of fluid within the porous material. Imperfect imbibition can occur due to vapor lock as formation of gas bubbles within a pore can block flow. It is not obvious that a bonding agent can be used to improve imbibition in the presence of vapor lock. In one embodiment, sublimation, vaporization and/or decomposition of the bonding agent 15 within a pore generates a gas bubble having a meniscus. As the bubble grows, the meniscus can contact the wall of the pore where it sticks and impedes flow. The meniscus can be divided into an upstream and downstream menisci. Known as the Gibbs-Marangoni effect, the upstream menisci are at a different temperature and hence different surface energy than the downstream menisci and statistically more condensation occurs at the downstream menisci than at the upstream menisci. This leads to the transport of the bonding agent through the bubble, preventing vapor lock.

The wetting properties of the carrier 10 can play a more significant role in transporting the bonding agent 15 into the carrier than transport purely driven by Darcy's law, which describes the flowrate of a fluid through a porous material. A consequence of the different pore sizes within an aerogel or xerogel is that the nano-pores will wick material more strongly than the micro-pores. Though an aerogel carrier may not support greater flow rates through the material, it exhibits significantly greater capillarity than the surface tension forces arising from fluid flowing into a capillary array and can generally support a greater porosity. While both pore structures are capable of transporting the liquid-states of the vaporizable bonding agent, in some embodiments, the sol-gel may be beneficial in that it can contain more bonding agent and will absorb the bonding agent with greater force.

Thus, various carriers may be used to hold, collect and store the condensed or solidified state of the bonding agent 15. In these embodiments, the bonding agent 15 will partially or entirely melt, evaporate, vaporize, decompose or sublimate as it transports into the permeable carrier 10, where it occupies the pores within. This transport of the bonding agent 15 into the carrier ensures a low-stress detachment of the substrate 20 from the carrier 10, as there is little to no surface tension holding the substrate 20 to the carrier 10. In other words, since the liquid-state bonding agent is wicked away from the substrate 20, the substrate 20 is able to easily detach from the carrier 10.

In certain embodiments, after the bonding agent 15 has been transported into the pores of the permeable carrier 10, the bonding agent 15 vaporizes, evaporates, sublimates or decomposes and is able to pass through the carrier 10. In other embodiments, the bonding agent 15 may remain within the pores of the permeable carrier 10 for a longer duration of time, in gaseous, liquid or solid phase.

In this way, a vaporizable bonding agent may be used with the flowchart of FIG. 4, wherein Process 140 includes an intermediate transition of the bonding agent to its liquid-states, where the liquid is transported into the carrier.

As described above, the bonding agent may be made to vaporize by increasing the temperature of the surrounding environment, lowering the pressure of that environment, or both, either locally or globally. This causes the bonding agent to vaporize first at its outer surfaces, which are exposed to the surrounding environment. As those outer surfaces vaporize, the process continues.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of detaching an article attached to a carrier with a bonding agent, comprising:
   causing said bonding agent to transition from a solid to a liquid-state bonding agent by heat or depressurization; and
   wicking the liquid-state bonding agent away from a gap between the carrier and the article; and
   transitioning the liquid-state bonding agent to a gas to release said article from said carrier.

2. The method of claim 1, wherein the carrier is permeable.

3. The method of claim 2, wherein the bonding agent transitions into the liquid-state bonding agent via at least one of decomposition or melting.

4. The method of claim 2, wherein the liquid-state bonding agent is at least partially stored within said permeable carrier.

5. The method of claim 2, wherein the liquid-state bonding agent passes through the permeable carrier.

6. The method of claim 2, wherein the liquid-state bonding agent transitions to a gas and at least some of the gas collects in the permeable carrier in at least one of its liquid or solid states.

7. A method of detaching an article attached to a carrier with a bonding agent, comprising:
releasing said article from the carrier by transitioning the bonding agent from a solid to a gas by globally increasing the temperature or decreasing the pressure locally or globally.

8. The method of claim 7, wherein the bonding agent is vaporizable or sublimable.

9. The method of claim 8, wherein the bonding agent comprises a molecule having one or more cores and one or more handles to optimize at least one of the solvent solubility, chemical resistance, cohesion, adhesion, melting point, heat capacity and vapor pressure.

10. The method of claim 8, wherein the bonding agent decomposes or is structurally modified into one or more sublimable or vaporizable species.

11. The method of claim 8, wherein the bonding agent undergoes photo-initiated scission or change in conformation to one or more agents with higher vapor pressures.

12. The method of claim 7, wherein the carrier is permeable.

13. The method of claim 12, wherein the permeable carrier comprises at least one of an aerogel, xerogel or other material produced from a soluble gel.

14. The method of claim 12, wherein the permeable carrier comprises at least one of a capillary array, frit, or porous fibrous material.

15. The method of claim 12, wherein the permeable carrier comprises an embedded structure that is not porous.

16. The method of claim 15, wherein the embedded structure adjusts at least one of thermal, electro-magnetic, fluidic or mechanical properties of the permeable carrier.

17. A method of processing a substrate to form a membrane, comprising:
mixing together a first bonding agent having a first melting point and a second bonding agent having a second melting point, higher than the first melting point, to form a bonding agent mixture;
melting the bonding agent mixture;
bonding a carrier to the substrate using the melted bonding agent mixture;
causing the first bonding agent to be evaporated, sublimated or otherwise removed from the bonding agent mixture, leaving behind the second bonding agent;
processing the substrate after the first bonding agent has been removed from the bonding agent mixture to form a membrane; and
sublimating or evaporating the bonding agent mixture after the processing to remove the membrane from the carrier.

18. The method of claim 17, wherein a temperature at which the bonding occurs is lower than a temperature at which any component of the mixture melts.

19. A method of detaching an article from a carrier, comprising:
releasing said article from the carrier by transitioning the carrier from a solid to a gas by increasing the temperature or decreasing the pressure locally or globally.

20. The method of claim 19, where the vaporizable bonding agent of the carrier is melted to initially attach it to the article.

21. The method of claim 19, wherein the carrier comprises one or more sublimable or vaporizable materials.

22. The method of claim 19, wherein the article is attached to the carrier without any intervening layers of bonding agent.

23. A method of detaching an article attached to a permeable carrier with a bonding agent, comprising:
releasing said article from the permeable carrier by transitioning the bonding agent from a solid to a gas by increasing the temperature or decreasing the pressure locally or globally.

24. The method of claim 23, wherein the bonding agent is vaporizable or sublimable.

25. The method of claim 24, wherein the bonding agent comprises a molecule having one or more cores and one or more handles to optimize at least one of the solvent solubility, chemical resistance, cohesion, adhesion, melting point, heat capacity and vapor pressure.

26. The method of claim 24, wherein the bonding agent decomposes or is structurally modified into one or more sublimable or vaporizable species.

27. The method of claim 24, wherein the bonding agent undergoes photo-initiated scission or change in conformation to one or more agents with higher vapor pressures.

28. The method of claim 23, wherein the permeable carrier comprises at least one of an aerogel, xerogel or other material produced from a soluble gel.

29. The method of claim 23, wherein the permeable carrier comprises at least one of a capillary array, frit, or porous fibrous material.

30. The method of claim 23, wherein the permeable carrier comprises an embedded structure that is not porous.

31. The method of claim 23, wherein the embedded structure adjusts at least one of thermal, electro-magnetic, fluidic or mechanical properties of the permeable carrier.

32. A method of detaching an article attached to a carrier with a bonding agent, comprising:
releasing said article from the carrier by transitioning the bonding agent from a solid to a liquid and/or a gas by increasing the temperature or decreasing the pressure locally or globally,
wherein the bonding agent undergoes photo-initiated scission or change in conformation to one or more agents with higher vapor pressures.

33. A method of detaching an article attached to a carrier with a bonding agent, comprising:
releasing said article from the carrier by transitioning the bonding agent from a solid to a liquid and/or a gas by increasing the temperature or decreasing the pressure locally or globally,
wherein the bonding agent comprises a molecule having one or more cores and one or more handles to optimize at least one of the solvent solubility, chemical resistance, cohesion, adhesion, melting point, heat capacity and vapor pressure.

34. A method of processing a substrate to form a membrane, comprising:
mixing together a first bonding agent having a first melting point and a second bonding agent having a second melting point, higher than the first melting point, to form a bonding agent mixture;
melting the bonding agent mixture;
bonding a carrier to the substrate using the melted bonding agent mixture;

processing the substrate form a membrane; and sublimating or evaporating the bonding agent mixture after the processing to remove the membrane from the carrier.

35. The method of claim 34, wherein the first bonding agent is evaporated, sublimated or otherwise removes from the bonding agent mixture, leaving behind the second bonding agent.

36. The method of claim 34, wherein the mixture comprises more than two bonding agents.

37. The method of claim 34, wherein a temperature at which the bonding occurs is lower than a temperature at which any component of the mixture melts.

* * * * *